United States Patent [19]

Muto et al.

[11] Patent Number: 4,826,787

[45] Date of Patent: May 2, 1989

[54] METHOD FOR ADHESION OF SILICON OR SILICON DIOXIDE PLATE

[75] Inventors: Masaaki Muto, Yokohama; Takashi Kato, Sagamihara; Takashi Ito, Kawasaki, all of Japan

[73] Assignee: Fujitsu Limited, Kawasaki, Japan

[21] Appl. No.: 27,317

[22] Filed: Mar. 18, 1987

[30] Foreign Application Priority Data

Mar. 18, 1986 [JP] Japan ................... 61-059744

[51] Int. Cl.$^4$ ............................ H01L 21/18
[52] U.S. Cl. .................... 437/208; 437/247; 228/193
[58] Field of Search ............ 437/208, 247, 205, 206, 437/51, 245; 228/123, 75, 193, 194, 198, 263.21

[56] References Cited

U.S. PATENT DOCUMENTS 3,239,908  3/1966  Nakamura ..................... 437/208
3,478,415  11/1969 Selman ........................ 228/193

FOREIGN PATENT DOCUMENTS 0017158  1/1982  Japan ........................ 437/208

OTHER PUBLICATIONS

J. B. Lasky et al., "Silicon-On-Insulator (SOI) Bonding and Etch-Back", International Electron Devices Meeting, 1985., pp. 684–687.
K. Furukawa et al., "Lattice Configuration and Electrical Properties at the Interface of Direct Bonded Silicon", Extended Abstracts of the 18th (1986 International) Conference on Solid State Devices and Materials, Tokyo, Japan, 1986, pp. 533–536.
S. P. Murarka, "Silicides for VLSI Application", Academic Press, 1983, p. 77.

Primary Examiner—Donald L. Walton
Attorney, Agent, or Firm—Staas & Halsey

[57] ABSTRACT

According to the present invention, a silicon wafer, silicon dioxide wafer or silicon wafer having a silicon dioxide film thereon can be mutually adhered. The procedure for the adhesion is that a refractory metal, such as zirconium, is deposited by sputtering on a flat surface to be adhered, and tightly stacked onto another substrate made of silicon, silicon dioxide or silicon having a silicon dioxide film thereto, and the stacked wafers are heated in an atmosphere of argon containing 4% hydrogen at approximately 650° C. for approximately 2 hours. The heat causes the deposited zirconium to react with the silicon of both the contacting wafers and is converted into a zirconium silicide alloy, which bonds the wafers. If the wafer is silicon dioxide or coated with silicon dioxide, the zirconium reduces the dioxide to produce silicon, which is then alloyed with the zirconium. Refractory metals other than group IVa and group Va elements can adhere silicon to silicon only. Advantages of this adhesion method are: the process is carried out at approximately 650° C., which does not harm fabricated devices; the adhesion withstands temperatures of 1000° C. which are used for fabricating devices; and the processing does not require strict control of the surface conditions. This method can be applied to the process of making SOI, a wafer-scale integrated LSi, or a three-dimensional LSI.

11 Claims, 9 Drawing Sheets

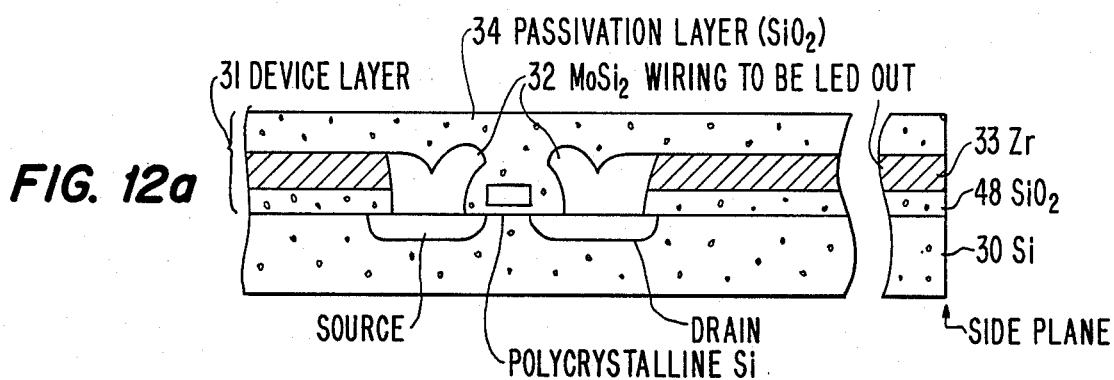
FIG. 12a
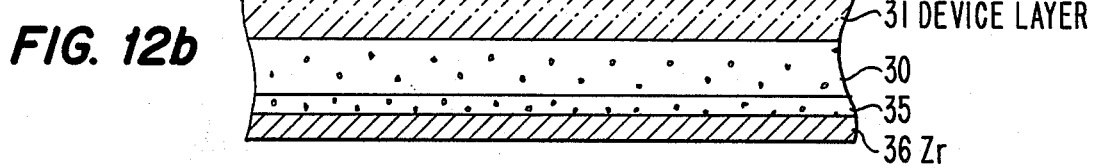
FIG. 12b
FIG. 12c
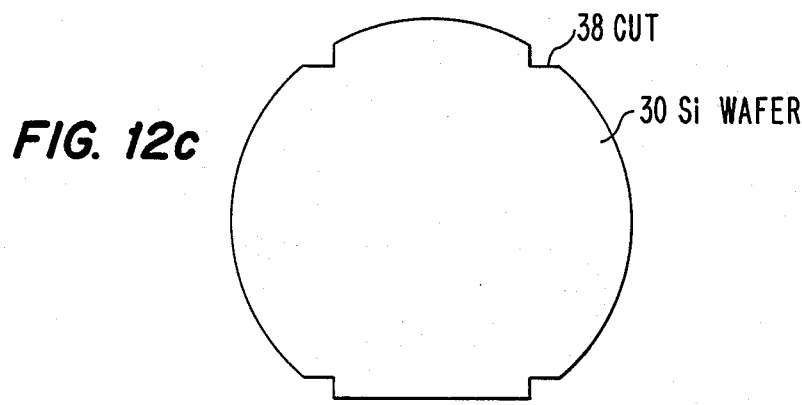
FIG. 12d
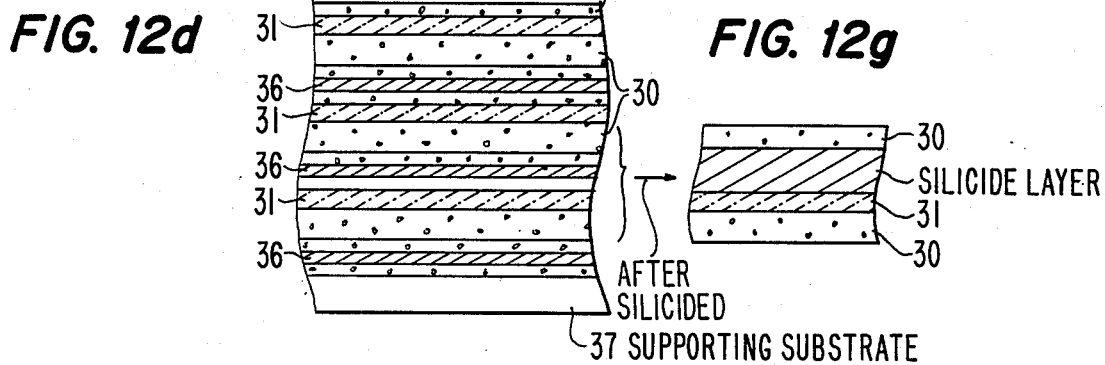
FIG. 12g

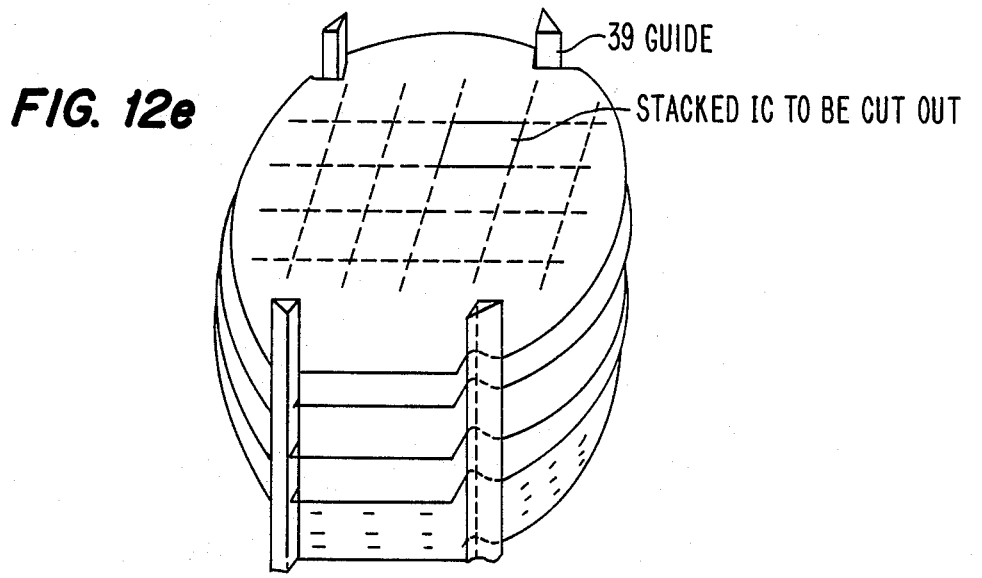
FIG. 12e
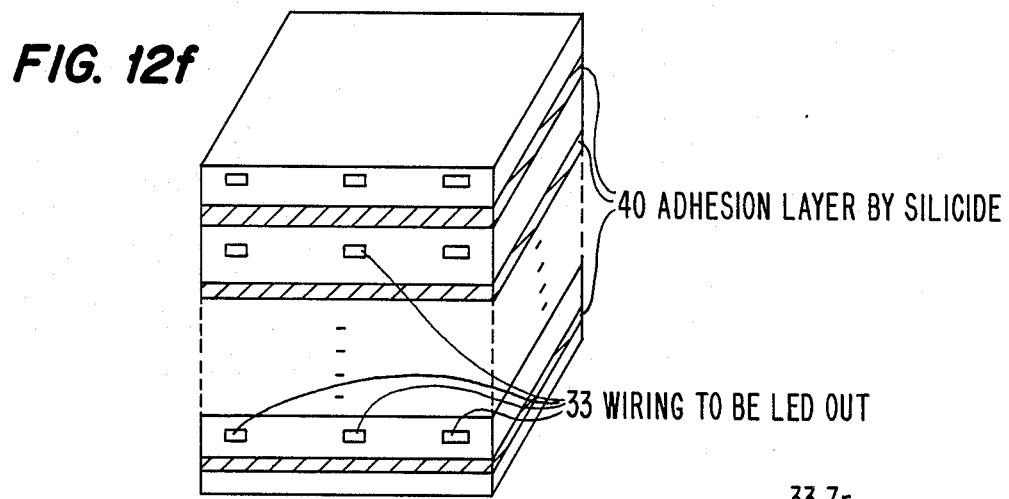
FIG. 12f
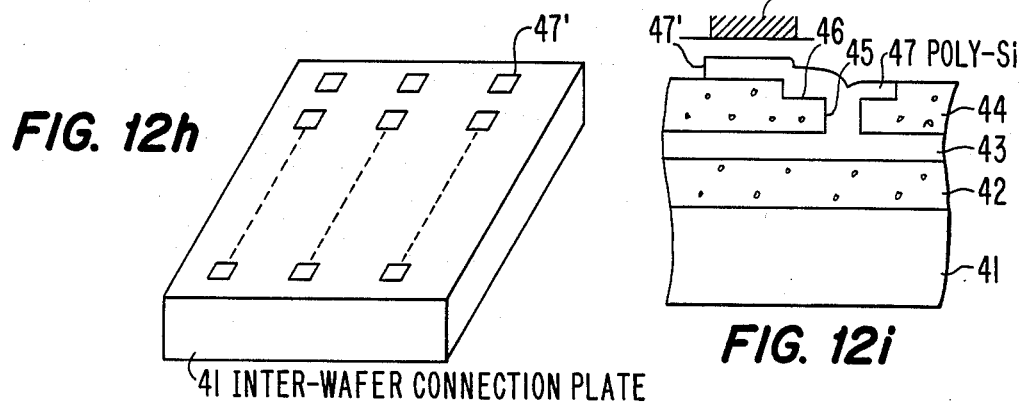
FIG. 12h
FIG. 12i

METHOD FOR ADHESION OF SILICON OR SILICON DIOXIDE PLATE

BACKGROUND OF THE INVENTION

The present invention relates to the mutual adhesion of silicon or silicon dioxide substrates for semiconductor fabrication, more particularly, the present invention includes forming a silicon alloy layer between the substrate at a low enough temperature to prevent damage to circuit elements on the substrates.

DESCRIPTION OF THE RELATED ART

During the past several years, many methods have been tried to mutually adhere silicon or silicon dioxide substrate to achieve enhancement of the scale of integration of a semiconductor VLSI (Very Large Scale Integration) or for other purposes, such as fabrication of a high-voltage CMOS device, and three typical methods are described below.

The first method is to mutually adhere silicon dioxide plates, or silicon substrates having a silicon dioxide film thereon, to form a so-called SOI (Silicon-On-Insulator) which enables the production of a three-dimensional VLSI structure. According to this method, oxidized flat surfaces of two Si (silicon) substrates are pressed together and heated in an oxidizing atmosphere at temperatures greater than 700° C. Bonding is achieved by polymerization of silinol bonds between the wafers. This method was reported in "Silicon-On-Insulator (SOI) by Bonding and Etch-Back" by J. B. Lasky et al. in International Electron Devices Meeting, 1985.

The second method is to press two mirror-polished and chemically hydrophilized surfaces of Si substrates together and then heat them in nitrogen gas at 1000° C. to achieve strong adhesion. This method was reported in "Lattice Configuration and Electrical Properties at the Interface of Direct Bonded Silicon" by K. Furukawa et al. in *Extended Abstracts of the 18th* (1986 *International*) *Conference on Solid State Devices and Materials,* Tokyo, 1986. While SOI can be achieved by either of the above methods, when using the methods in conjunction with IC chips, such as those having wiring patterns thereon, the high adhesion temperatures (as high as 700° to 1000° C.) can adversely effect the IC circuits.

The third method utilizes a PSG (Phosphorus Silicate Glass) or an organic material, such as polymide, etc., as an adhesive, to perform so-called wafer-scale integration at a temperature as high as 1000° C. In wafer-scale integration, many conventional IC chips are adhered to a large silicon wafer close to each other, and gaps between the chips are filled with an insulating material. Then, aluminum layer wiring is fabricating on the insulating material to interconnect the chips. Alternatively so-called three-dimensional IC's can be assembled by stacking substrates which have elements already fabricated thereon.

In all of the above-mentioned typical methods, the silicon chip and wafers or silicon dioxide film and plates must be bonded to each other. However, in the first method, the substrate must be heated to temperatures as high as 700°–1000° C. The PSG can provide stable adhesion, but also requires temperatures as high as 1000° C. for the adhesion process, and the organic adhesives cannot withstand the temperatures of later wafer processing stages, such as in general MOS processing. At the high temperatures there also is a problem of carbon contamination of the surfaces of the substrate which can damage the circuits thereon.

An adhesion method in which mutual adhesion of silicon, silicon dioxide or silicon having a silicon dioxide film thereon at a temperature low enough to avoid damage to the fabricated elements, with no harmful after effects, has been sought to overcome the above-mentioned problems.

SUMMARY OF THE INVENTION

It is an object of the present invention to provide a reliable adhesion method which is capable of mutually adhering substrates of silicon (Si), silicon dioxide ($SiO_2$), or Si having an $SiO_2$ film thereon, at a temperature low enough to not adversely affect fabricated elements during the adhesion process while leaving no harmful after effects, such as carbon contamination.

It is a further object of the present invention to bond substrates by compressing a refractory metal layer between the substrates and then heating the substrates and the refractory metal layer at a temperature which will not harm IC's fabricated on the substrates.

In accordance with the present invention, mutual adhesion of Si or $SiO_2$ is carried out by forming a metal silicide layer on each surface to be adhered. The steps of the adhesion method are as follows: A refractory metal film, such as zirconium (Zr), is deposited, by DC magnetron sputtering, for example, on a surface of a first plate made of Si, $SiO_2$, or Si having $SiO_2$ film thereon. Keeping the deposited surface towards a second plate, the first plate is tightly stacked on the second plate, which is made of Si, $SiO_2$, or Si having $SiO_2$ film thereon. The stacked plates are heated at approximately 650° C. in an inert atmosphere, such as an argon gas containing 4% hydrogen during which the deposited zirconium diffuses into both the plates forming a metal silicide alloy. The silicide alloy on both plates acts as an adhesive agent. If the plate is $SiO_2$ or its film, the Zr reduces the Si dioxide and bonds with the reduced Si to form silicide.

The above-mentioned features and advantages of the present invention, together with other objects and advantages, which will become apparent, will be more fully described hereinafter, reference being had to the accompanying drawings forming a part hereof, wherein like numerals refer to like parts throughout.

BRIEF DESCRIPTION OF THE DRAWINGS

FIG. 11a is the plain view, and FIG. 11b is the cross-sectional view;

FIGS. 12a through 12i show steps for fabricating a three-dimensional IC according to the present invention.

DESCRIPTION OF THE PREFERRED EMBODIMENTS

Figure 1:
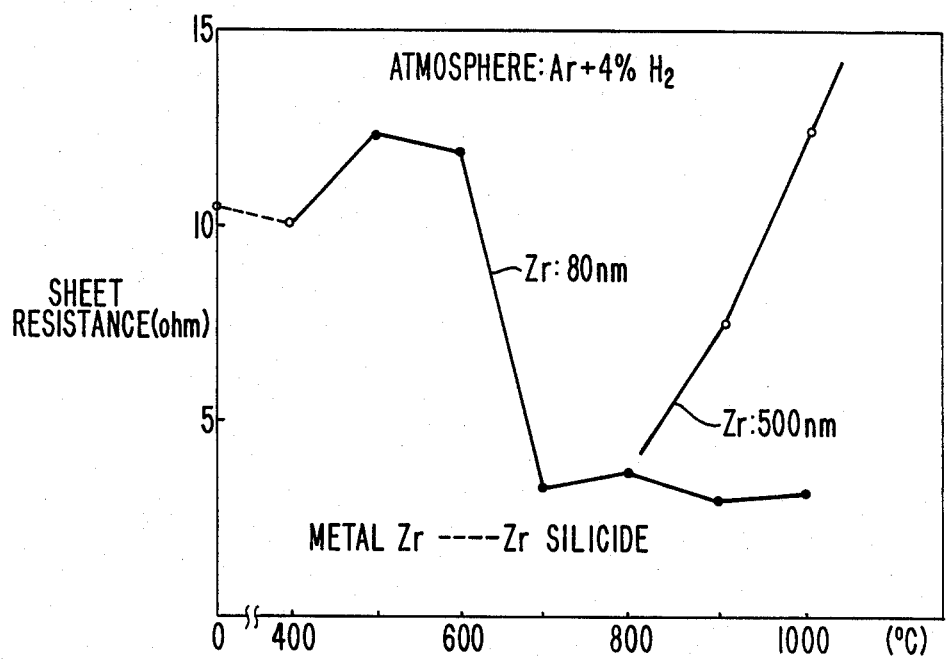
FIG. 1 is a graph of sheet resistance of a Zr film silicide layer as a function of the heating temperature.

As is well known, metal silicides have been employed as conductors on ICs, and their properties have been deeply investigated and reported to the public. Metal silicides are alloys produced by the diffusion of metals into Si at an elevated temperature. A silicide alloy thus formed can also act as an adhesive agent in accordance with the present invention. Temperatures for forming silicide are known, for example, 500° C. is required for titanium, 525° C. for molybdenum, 600° C. for hafnium, 650° C. for tantalum, and 650° C. for tungsten. As an example, the effect of temperatures on the formation of zirconium silicide as measured by the inventors is shown in FIG. 1. The sheet resistance Rs is shown on the ordinate and indicates that the Zr film is converted into Zr silicide because resistivity of Zr silicide is much lower than that of metal Zr.

Figure 2:
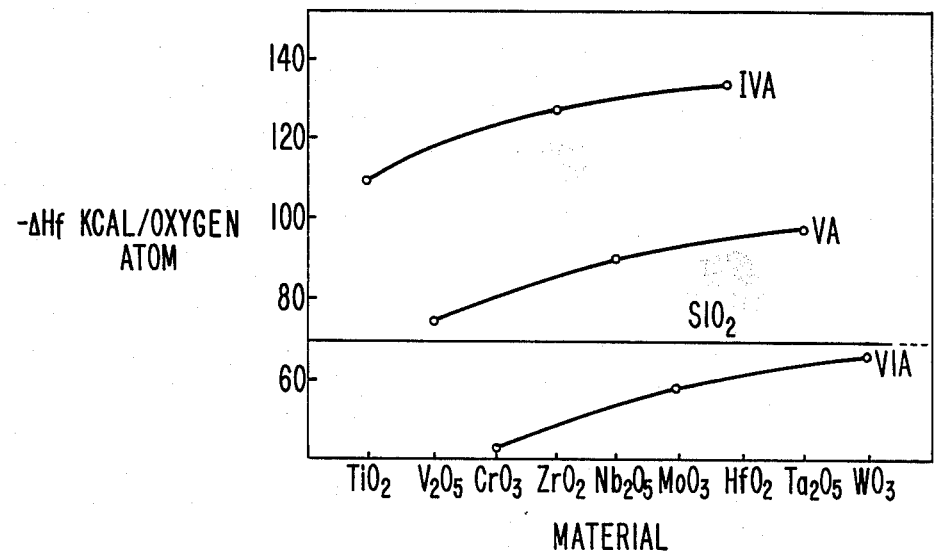
FIG. 2 is a graph of the heat of formation of various refractory metals.

Heats of formation required for forming metal silicide with silicon dioxide have been investigated and reported, for example, as shown in FIG. 2. The graph shown of FIG. 2 is from "SILICIDES FOR VLSI APPLICATION" by S. P. Murarka, published by Academic Press, 1983 which is incorporated by reference herein. Refractory metals which can reduce (deoxidize) silicon dioxide, SiO$_2$, are metals which have negative formation temperatures, the value of which are larger than the formation temperature of SiO$_2$. Reduction metals are the groups IVa and Va in FIG. 2. Among these metals in particular, titanium (Ti), zirconium (Zr) and hafnium (Hf) are very reactive with SiO$_2$ resulting in good adhesion properties. The reaction mechanism is explained by the following equations, where x and y denote the respective amount of atoms, i.e., ZrO$_y$ means ZrO, ZrO$_2$, and ZrSi$_x$ means ZrSi, ZrSi$_2$, etc.:

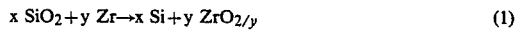

The reactions go in the direction of the arrows, because the state having the larger negative value of heats of formation is more thermodynamically stable; therefore, the reaction goes from the SiO$_2$ side to the side of formation of ZrO$_{2/y}$ side, as shown in the equation (1), which means SiO$_2$ is reduced by Zr to form Si and ZrO$_{2/y}$. Then, the Si reacts with Zr to form zirconium silicide, Zr$_n$Si$_x$. Details of the adhesion process, in which Zr is used for forming adhesive silicide layer, are described below for each combination of the substrate types to be fused.

Figure 3A:
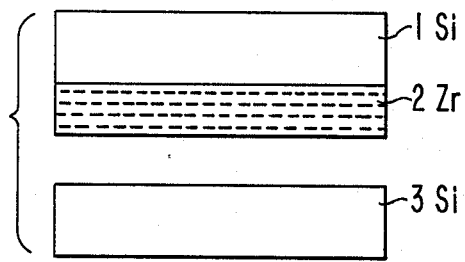
FIGS. 3a through 3d are cross-sectional views which schematically illustrate the steps for bonding Si to Si according to the present invention.
Figure 3B:
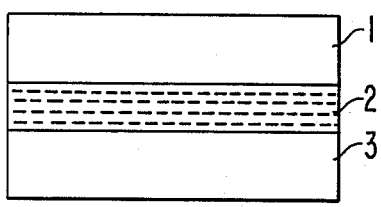
Figure 3C:
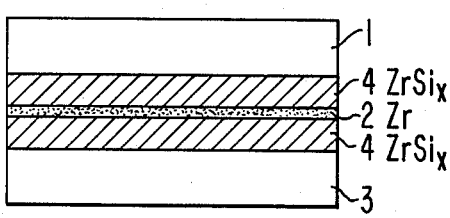
Figure 3D:
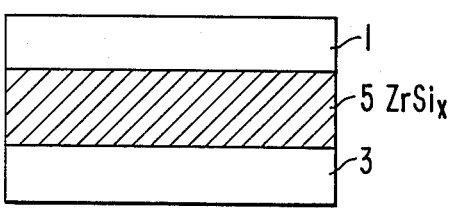
Figure 6:
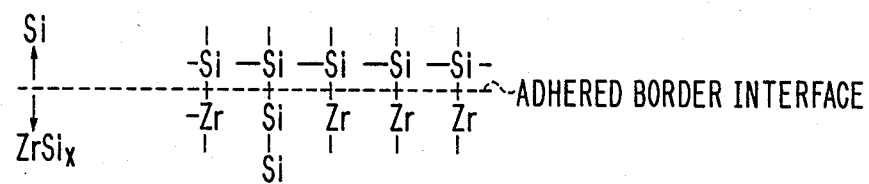
FIG. 6 schematically illustrates the lattice structure caused by bonding Si with Zr according to the present invention.

The adhesion process of Si to Si is schematically illustrated in FIGS. 3a through 3d. As shown in FIG. 3a, Zr is deposited on a flat surface of a silicon substrate 1 by, for example, a known DC magnetron sputtering method to form an approximately 130 nm thick film 2. The substrate 1 with the Zr film is turned over and stacked on a second flat Si substrate 3, as shown in FIG. 3b, sandwiching the Zr film tightly between the two Si substrates. Next, the sandwiched layers 1-3 are heated at 650° C. in an atmosphere of Ar (argon gas) containing 4% H$_2$ (hydrogen gas) for approximately 30 minutes. Zr silicide, ZrSi$_x$, is formed as an alloy in both the Si substrates 1 and 3 as shown in FIG. 3c and this reaction continues until finally all of the Zr film 2 is converted into silicide alloy 5 as shown in FIG. 3d. The Zr silicide layer 5, approximately twice as thick as the original Zr film 2, acts as an adhesive agent to strongly bond the two Si substrates 1 and 3 to each other. The lattice structure of the bond is schematically illustrated in FIG. 6. As is seen in the figure, on Si atom in an Si substrate and a Zr atom in the silicide form Si—Zr bonding. Good adhesion is achieved even if some of the metal Zr does not get converted into the silicide.

Figure 4A:
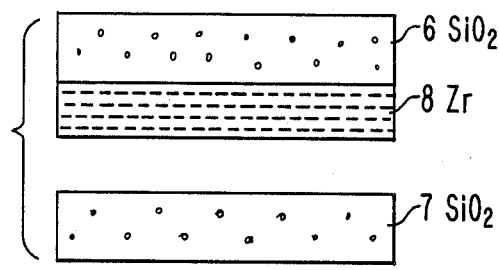
FIGS. 4a through 4c are cross-sectional views which schematically illustrate the steps for adhering $SiO_2$ to $SiO_2$ according to the present invention.
Figure 4B:
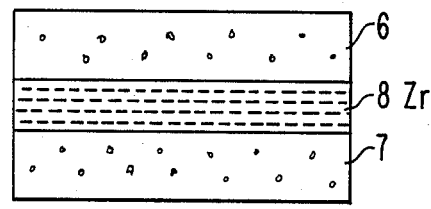
Figure 4C:
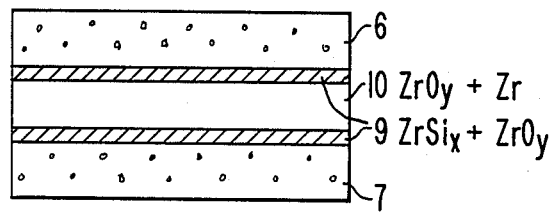
Figure 5A:
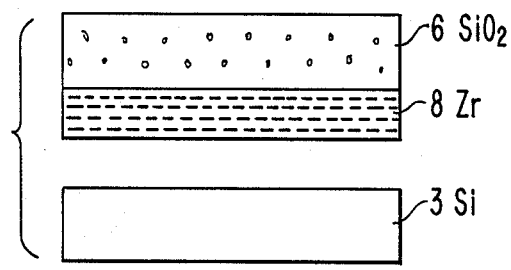
FIGS. 5a through 5d are cross-sectional views which schematically illustrate the steps for bonding Si to an Si substrate having $SiO_2$ film thereon according to the present invention.
Figure 5B:
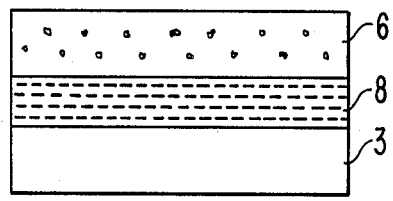
Figure 5C:
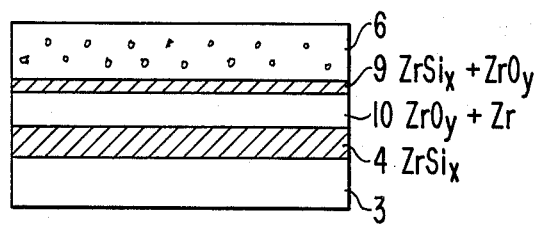
Figure 5D:
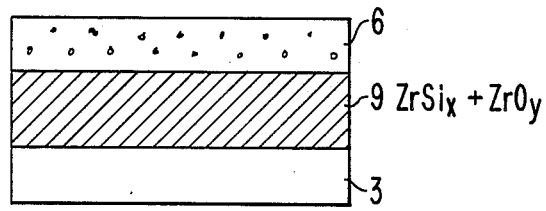
Figure 7:
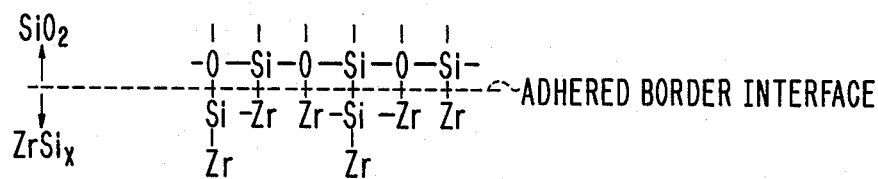
FIG. 7 schematically illustrates the lattice structure caused by bonding Si with SiO$_2$ by Zr according to the present invention.

The adhesion process of SiO$_2$ to SiO$_2$ is schematically illustrated in FIG. 4a through 4c. The adhesion procedure is fundamentally the same as that of the adhesion of Si to Si, but requires a higher temperature and longer time to perform the bonding than that of Si to Si bonding. Further, at the border surface of the Zr and the SiO$_2$, the reducing reaction of equation (1) and silicidizing reaction of equation (2) take place simultaneously. As shown in FIG. 4c, ZrO$_{2/y}$ produced by the equation (1) diffuses into the metal Zr layer, and the ZrO$_{2/y}$ does not prevent the silicide reaction, but slows the speed of silicidizing reaction. For example, a heating time of 60 minutes or more at 800° C. or more is required. The lattice structure of the bonding is shown in FIG. 7. It is not necessary to convert all of the deposited Zr into silicide, and the adhesion can be achieved as long as Si—Zr or O—Zr bonding is formed. O—Zr remaining in the metal Zr causes no harmful effect.

Adhesion of Si to SiO$_2$ is schematically illustrated in FIGS. 5a through 5d while the lattice structure of the bond is substantially the same as that of the Si to Si bond illustrated in FIG. 6. The adhesion mechanism is the same as those explained above for Si to Si bonding.

Figure 8:
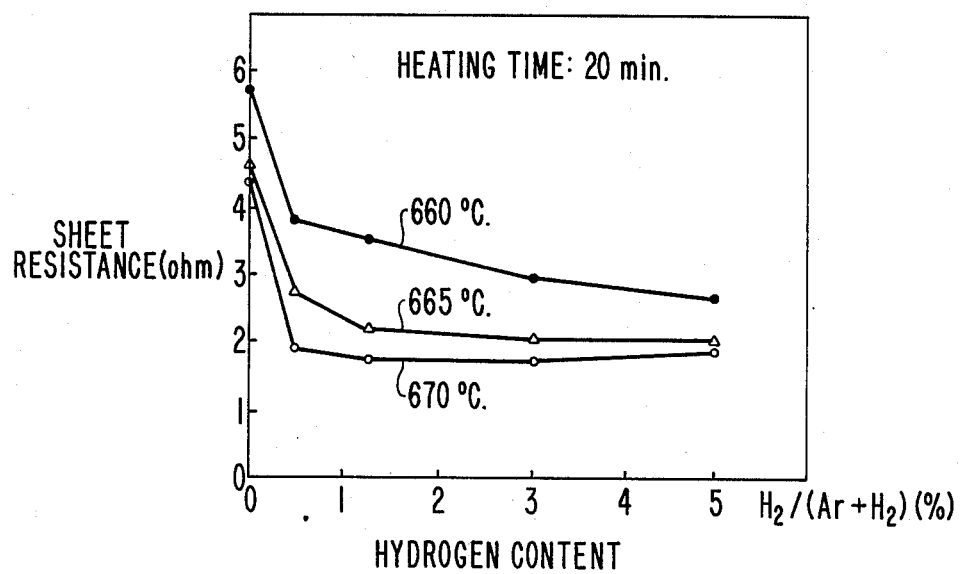
FIG. 8 is a graph of a sheet resistance of a Zr film forming a silicide layer as a function of the H$_2$ content in Ar.
Figure 9:
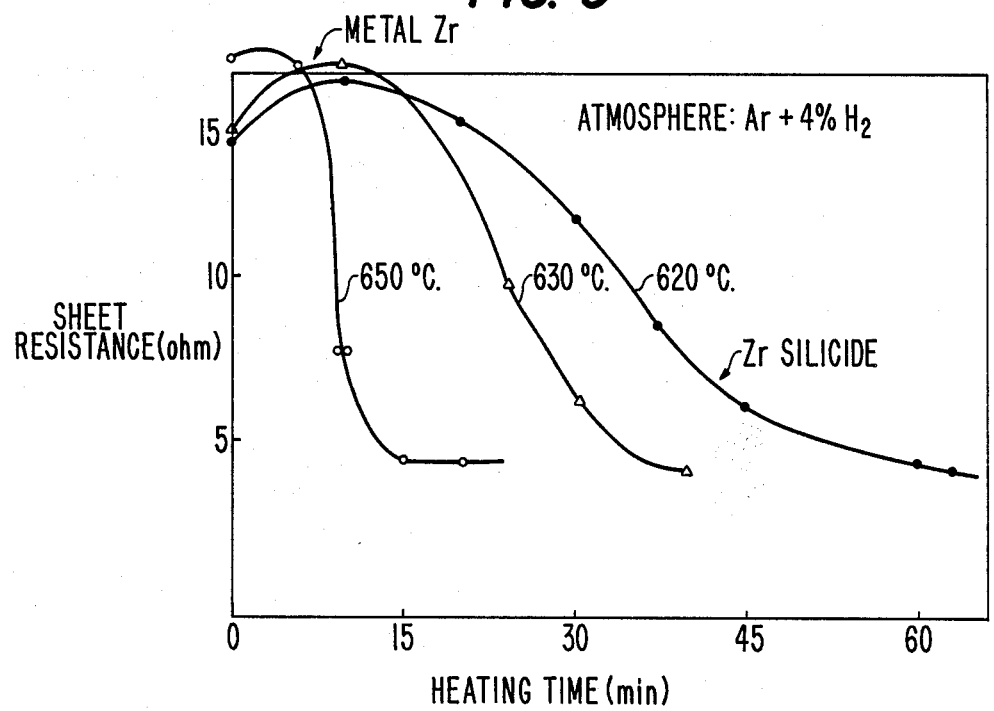
FIG. 9 is a graph of the sheet resistance of a Zr film silicide layer as a function of the heating time.

FIG. 1 indicates that the silicide, ZrSi$_2$, is formed at higher than 600° C. A reducing reaction also begins to take place at approximately 600° C., even though the reaction is slow. Therefore, at least 600° C. (approximately) is required for the adhesion process. The thin line on the right side in FIG. 1 indicates the sheet resistance of the formed silicide, when the Zr film is 500 nm thick. The increase in resistance at higher than 850° C. seems to indicate that the formed silicide layer develops cracks, due to thermal stress. Therefore, the Zr film must be below 500 nm thick for temperatures above 800° C. The atmospheric mix during adhesion is also important. The effect of H$_2$ content is shown in FIG. 8, where the resistance of a 130 nm Zr silicide film formed on a Si substrate is plotted with respect to H$_2$ content in Ar, at the indicated temperatures, for 20 minutes. As is seen in FIG. 8, the silicidization reaction is accelerated by an $H_2$ content of more than approximately 0.5%. The effect of the heating time based on data collected by the inventors are shown in FIG. 9, where the sheet resistance, as an indication of silicide formation, is plotted as a function of heating time, at the indicated temperatures, in Ar containing 4% $H_2$. The conditions for the most effective adhesion is an atmosphere of inert gas containing more than 0.5% of $H_2$, a temperature of more than 600° C., and a heating time of more than 15 minutes with a temperature of more than 650° C. A thickness below 500 nm of the bonding metal is preferable, but when the heating temperature is 700°-800° C., the thickness is not limited. Additionally, refractory metals other than groups IVa and Va can be used.

Figure 13:
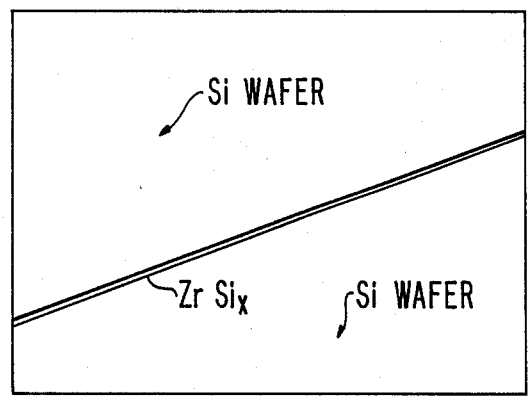
FIG. 13 is a drawing of a cross-sectional adhered portion of Si to Si by Zr as viewed through a scanning electron microscope.

FIG. 13 is a drawing of a SEM (Scanning Electron Microscope) photograph of the bonded portion of Si wafers. The semiconductor wafer specimen is made by sputter depositing a 200 nm thick Zr film, stacking the filmed layer on another Si wafer, and heating the stacked layers in Ar containing 4% $H_2$ at 700° C. for 30 minutes in an electric furnace. Perfect adhesion, with no voids, is observed. The specimen was tested for its durability, by being exposed to heat-cycling at 1000° C., which is equivalent to the temperature of later MOS processing, and no peeling or separation was observed. Thus, this method provides substantially perfect adhesion. Furthermore, a similar semiconductor wafer specimen having a 500 nm thick $SiO_2$ film thereon was made and tested, resulting in the same good, uniform adhesion. Three different applications of the adhesion process according to the present invention are described below.

Figure 10A:
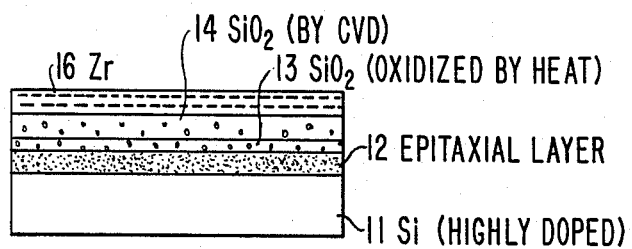
FIGS. 10a through 10d are cross-sectional views which show steps for fabricating SOI according to the present invention.
Figure 10B:
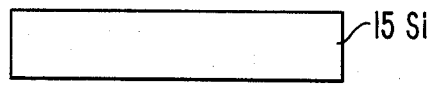
Figure 10C:
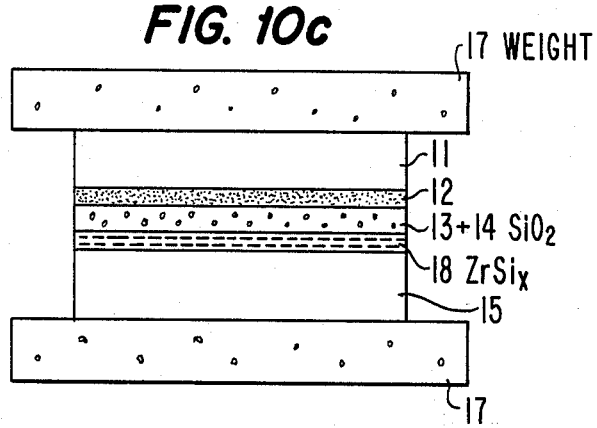
Figure 10D:
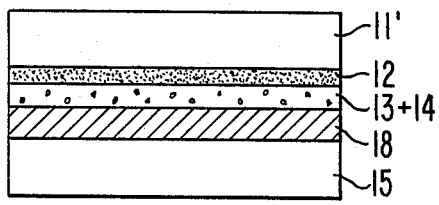

A fabrication process of an SOI is shown in FIGS. 10a through 10d. On an Si wafer 11, having a surface index of (100 or (111), doped with As (arsenic) or other dopant having a concentration of approximately $10^{20}$, an epitaxial layer 12 is grown to approximately 600 nm by a known thermal epitaxial-growth method, at 950° C., in an atmosphere of $SiH_4$ (monocilane gas). The surface of the epitaxial layer 12 is oxidized by a known wet oxidation method to form a 100 nm thick oxide layer 13. A 1 $\mu$m thick $SiO_2$ layer 14 is additionally deposited thereon, by a known CVD (chemical vapor deposition) method, at 450° C. in an atmosphere of $O_2$ (oxygen gas) and $SiH_4$, as shown in FIG. 10a. On the $SiO_2$ layer 14, Zr is deposited to form a 150 nm thick film 16, using a known DC magnetron sputtering method in a plasma of $3\times10^{-3}$ Torr of argon. FIG. 10b shows another Si wafer 15. The wafers are stacked, with the Si layer 15 facing the Zr film 16. The stacked wafers are sandwiched by two quartz plates 17 having, for example, 2 to 10 mm thickness (FIG. 10c), and heated in an atmosphere of Ar containing 4%$H_2$ at 670° C., for 2 hours. While the stack is heated, the wafers are tightly pressed to each other by the weight of the quartz place. For example, for wafers of 4 inches in diameter, a quartz plate of approximately 15 $dm^2$ is applying a force of approximately 5 to 30 $g/cm^2$. As a result, the Zr film 16 converts into silicide 18. Thus, the wafers are bonded to each other, as shown in FIG. 10c. Next, the outer surface of the wafer 15 is glued to a temporary support plate (not shown in the figure). The temporary support plate is fixed onto a lapping-polish machine, and the outer surface of the wafer 11 is removed by lapping-polish using abrasives, such as alumina powder, to leave a doped Si substrate 11' several $\mu$m thick. The adhered and polished wafers are removed from the temporary support plate by heating, and washing with a solvent, such as trichloroethylen. The remaining several $\mu$m thick Si layer 11' is etched by an etchant, $8CH_3COOH+3NO_3+1HF$ (which is very reactive with Si doped with $n^+$ or $p^+$, but not reactive with Si having a concentration below $10^{17}$–$10^{18}$), until the epitaxial layer 12 is exposed. Thus, an SOI substrate is produced using silicide as an adhesion agent. Any desirable device can then be fabricated on the SOI substrate in a similar way for conventional IC fabrication.

Figure 11A:
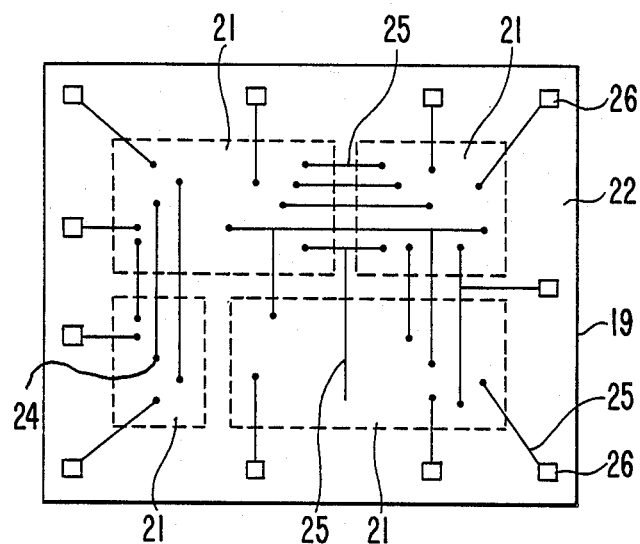
FIGS. 11a and 11b show the structure of a wafer-scale LSI according to the present invention where
Figure 11B:
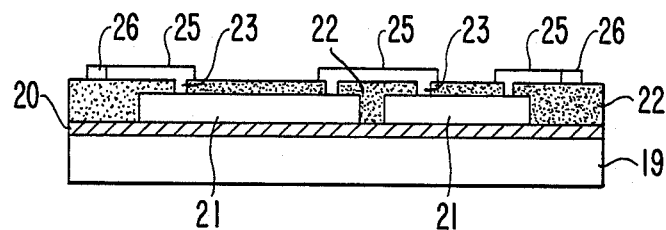

A cross-sectional view and a plan view of a wafer-scale LSi are shown in FIGS. 11a and b. On a main Si substrate wafer 19 (up to several inches in size) a Zr film 20 is deposited, and IC chips 21 are placed thereon. The wafer, film and chips are heated until the Zr layer is converted into a silicide, so that the IC chips 21 adhere to the Si wafer 19. Next, gaps between the IC chips 21 are filled with, and the surfaces of the IC chips 21 are coated with an insulation material, such as polyimide, to form an isolation layer 22. When the polyimide layer 22 is coated, windows 23 are formed over terminal pads 24 on the IC chips. Next, wiring is patterned over the windows 23 as well as over the polyimide layer 22 so that the adhered ICs are interconnected and connected to outer circuits through the pads 26 formed on the polyimide layer 22. An advantage of this configuration is that the thermal expansion coefficient of the IC chips and that of the main substrate 11 are the same, and the adhesion is excellent. High density heat consumption is acceptable on this large size substrate wafer, resulting in an excellent wafer-scale LSI.

A fabrication process for a three-dimensional IC is shown in FIG. 12a through 12g'. As is shown in FIG. 12a, desired IC devices are fabricated in a device layer 31 on a silicon wafer 30 according to a conventional IC fabrication technique. Rather than using aluminum to form the wiring layers, however, the wiring layers are formed of a refractory metal or a metal silicide, such as $MoSi_2$ 32 or Zr 33. As a result, the wiring layers can withstand the heat of an adhesion process at temperatures as high as 600° C. The Zr wiring layer 33 also acts as an adhesive agent in a subsequent inter-wafer connection process. As shown in FIG. 12a, the fundamental structure of the IC comprises a silicon wafer 30 with device layer 31 formed thereon. Passivation layers 34 made of $SiO_2$ etc., are also formed on the device area. The surface of the passivation layer 34 is not required to be absolutely flat. Amorphous silicon 35 is deposited (approximately 100 nm thick) on the surface of the wafer 30 and the device layer 31, as shown in FIG. 12b, and further, a layer 36 of Zr (approximately 150 nm thick) is deposited upon the amorphous silicon layer 35 adjacent to the surfaces of the wafer 30 by a known sputtering method. Amorphous silicon is effective for accelerating silicidation and lowering the silication temperature. As many wafers as are required are prepared and stacked onto each other and on a supporting substrate 37 as shown in FIG. 12d. For aligning the wafers while stacked, cuts 38 may be provided at the edges of each wafer, as shown in FIG. 12c, and aligned by guides 39, as shown in FIG. 12e. A quartz plate (10 to 15 mm thick, not shown in the figure) is placed on the top of the stacked wafers as a weight, and the stacks are heated in an atmosphere of Ar containing 4% $H_2$ at 600° C. for approximately half an hours. The silicidation reaction with the amorphous Si starts gradually at approximately 450° C., adhering all the wafers to each other by the formation of the silicide layers 40, as shown in FIG. 12f and FIG. 12g. Each after the Zr film 36 is converted into silicide with the amorphous layer 35, the majority of the Zr wiring layer 33 is not silicided, because the temperature is not high enough to cause all of the Zr wiring layer 33 to react with the contacting SiO₂ films 34. Next, the adhered wafers are vertically cut, using a diamond cutter for example, along the dotted lines shown in FIG. 12e to obtain three-dimensional cubes. The side walls of the cut cubes are polished so that edges of the Zr wiring layers 33 are exposed. Additionally, an inter-wafer connection plate 41 is prepared as follows. On an inter-wafer connection plate 41 made of Si, a 1 μm thick SiO₂ film 42 is formed and a polycrystalline silicon layer 43 (approximatley 700 nm thick) doped with impurities is patterned thereon. An SiO₂ film 44 is then formed on the polycrystalline layer 43. A contact hole 45, having a step 46, is formed in the SiO₂ film 44, as shown in FIG. 12i, which is a cross-sectional view of FIG. 12h. The contact hole 45 is filled with polycrystalline silicon 47 doped with impurities. The polycrystalline silicon 47 doped with impurities acts as an electrical conductor. A portion 47' of the polycrystalline silicon 47 is for contacting the exposed wiring layer 33 and is formed in a position to coincide with each corresponding exposed portion of the Zr wiring layer 33. The step 46 provides space for the polycrystalline silicon to connect the contact hole 46 and the portion 47'. As many inter-wafer connection plates 41 as are necessary are pressed onto the corresponding sides of the stacks respectively. They are then heated in an atmosphere of Ar containing 4% H₂ at 600° C. for approximately half an hour so that the exposed portion of Zr wiring 33 forms silicide with the polycrystalline silicon 47'. Thus, the inter-wafer connection plate 41 is bonded to the stacks, and electrical connections between the stacked wafers are established. Connection to an outer circuit can be made by wire bonding to bonding pads or by any other conventional technique. The Zr silicide adhesion layers 40 can also be used as an electrical shield between the stacked wafers and can be connected to a ground potential.

In the above-described embodiments and applications of the present invention, Zr is employed for forming silicide, however, it is apparent that other refractory metals, such as Ti or Hf, can be employed to adhere Si and/or SiO₂, and other refractory metals including molybdenum or tungsten can be employed to adhere Si to Si.

Further, in the above-described embodiments and applications of the present invention, Ar gas containing 4% H₂ is employed for the inert gas, however, it is apparent that other inert gases or a vacuum can be employed thereto.

Summarizing the advantages of the present invention, adhesion is carried out at temperatures as low as 650° C., while the adhesion can withstand as high a temperature as 1000° C. during later processing. The surfaces to be bonded do not require prior treatment by chemicals and do not have to be completely flat. Therefore, the surfaces are not as sensitive to dust as in the direct bonding of the prior art. Thus, stable and reliable adhesion can be achieved during mass production without strict process control requirements.

The many features and advantages of the invention are apparent from the detailed specification and thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A method for adhering first and second plates including silicon, comprising the steps of:
    (a) forming a refractory metal film on a surface of the first plate;
    (b) stacking the first plate on a surface of the second plate, with the refractory metal film facing the second plate; and
    (c) heating the first and the second plates in a predetermined atmosphere and at a predetermined temperature causing the refractory metal film to change to silicide to adhere the plates.

2. A method according to claim 1, wherein said refractory metal film is selected from a group including titanium, zirconium and hafnium.

3. A method according to claim 2, wherein said heating step (c) is in an inert atmosphere.

4. A method according to claim 3, wherein the inert atmosphere comprises argon gas containing at least 0.5% of hydrogen gas in volume.

5. A method according to claim 3, wherein said inert atmosphere is a vacuum.

6. A method according to claim 2, wherein said heating step (c) is at a temperature greater than or equal to 600° C.

7. A method according to claim 2, wherein said refractory metal film is 10 nm to 1000 nm thick.

8. A method according to claim 1, wherein said refractory metal film is formed by sputtering.

9. A method according to claim 1, wherein said first and said second plates are semiconductor substrates.

10. A method according to claim 1, wherein said first plate is formed of a material selected from a group including silicon, silicon dioxide, or silicon having a silicon dioxide film thereon.

11. A method according to claim 1, wherein said second plate is formed of a material selected from a group including silicon, silicon dioxide, or silicon having a silicon dioxide film thereon.

* * * * *

UNITED STATES PATENT AND TRADEMARK OFFICE
CERTIFICATE OF CORRECTION

PATENT NO.  :  4,826,787
DATED       :  MAY 2, 1989
INVENTOR(S) :  MASAAKI MUTO ET AL.

It is certified that error appears in the above-identified patent and that said Letters Patent is hereby corrected as shown below:

FRONT PAGE [57] ABSTRACT line 26, "LSi," should be --LSI,--.

Col. 1, line  9, "silicon" should be --silicide--;
      line 29, "silinol" should be --silanol--.

Col. 3, line 35, "temperatures" should be --temperature--;
      line 57, after "ZrO$_2$, insert --etc.,--.

Col. 6, line 54, "silication" should be --silicidation--.

Signed and Sealed this

Thirtieth Day of January, 1990

*Attest:*

JEFFREY M. SAMUELS

*Attesting Officer*    *Acting Commissioner of Patents and Trademarks*